(12) United States Patent
Mo et al.

(10) Patent No.: US 9,093,405 B2
(45) Date of Patent: Jul. 28, 2015

(54) ORGANIC LIGHT-EMITTING DISPLAY APPARATUS

(71) Applicant: SAMSUNG DISPLAY CO., LTD., Yongin, Gyeonggi-Do (KR)

(72) Inventors: Yeon-Gon Mo, Yongin (KR); Min-Kyu Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/061,366

(22) Filed: Oct. 23, 2013

(65) Prior Publication Data

US 2014/0339515 A1  Nov. 20, 2014

(30) Foreign Application Priority Data

May 15, 2013  (KR) .................. 10-2013-0055279

(51) Int. Cl.
  *H01L 27/32*  (2006.01)
(52) U.S. Cl.
  CPC .......... *H01L 27/3248* (2013.01); *H01L 27/3265* (2013.01)
(58) Field of Classification Search
  CPC ................... H01L 27/3248; H01L 27/3265
  USPC ................. 257/40, 59, 72, E51.018
  See application file for complete search history.

(56) References Cited

U.S. PATENT DOCUMENTS

| | | | |
|---|---|---|---|
| 7,435,992 B2 * | 10/2008 | Choi et al. | 257/72 |
| 7,480,024 B2 * | 1/2009 | Kim et al. | 349/141 |
| 7,507,998 B2 * | 3/2009 | Tseng | 257/72 |
| 7,867,051 B2 * | 1/2011 | Kang | 445/24 |
| 7,893,440 B2 * | 2/2011 | Kwon et al. | 257/72 |
| 8,575,606 B2 * | 11/2013 | Park et al. | 257/43 |
| 8,581,255 B2 * | 11/2013 | Wei et al. | 257/59 |
| 2006/0145162 A1 | 7/2006 | Yang | |
| 2011/0108848 A1 * | 5/2011 | Lee et al. | 257/72 |
| 2011/0147757 A1 * | 6/2011 | Kim et al. | 257/71 |
| 2013/0119388 A1 * | 5/2013 | Lee et al. | 257/59 |
| 2014/0320766 A1 * | 10/2014 | Tamura et al. | 349/12 |

FOREIGN PATENT DOCUMENTS

| | | |
|---|---|---|
| KR | 1999-005140 | 1/1999 |
| KR | 10-2006-0044256 | 5/2006 |
| KR | 10-2006-0077895 | 7/2006 |

OTHER PUBLICATIONS

English Abstract for Publication No. 10-0486197 (for 1999-005140), Apr. 21, 2006.

* cited by examiner

*Primary Examiner* — Ida M Soward
(74) *Attorney, Agent, or Firm* — F. Chau & Associates, LLC

(57) ABSTRACT

An organic light-emitting display apparatus includes a substrate. A capacitor is formed on the substrate. The capacitor includes a first lower electrode, a second lower electrode, an upper electrode, a first insulating layer disposed between the first lower electrode and the second lower electrode, and a second insulting layer disposed between the second lower electrode and the upper electrode. A thin film transistor (TFT) includes a gate electrode disposed on a same layer as the first lower electrode, an active layer, and source and drain electrodes disposed on a same layer as the upper electrode. A wiring includes the same material layer as the second lower electrode.

10 Claims, 7 Drawing Sheets

ORGANIC LIGHT-EMITTING DISPLAY APPARATUS

CROSS-REFERENCE TO RELATED PATENT APPLICATION

This application claims priority to Korean Patent Application No. 10-2013-0055279, filed on May 15, 2013, in the Korean Intellectual Property Office, the disclosure of which is herein incorporated by reference in its entirety.

TECHNICAL FIELD

The present invention relates to a display apparatus, and more particularly, to an organic light-emitting display apparatus and a method of manufacturing the organic light-emitting display apparatus.

DISCUSSION OF THE RELATED ART

Flat panel display devices such as organic light-emitting display devices, liquid crystal display (LCD) devices, and the like are generally manufactured on a substrate on which a pattern, including a thin film transistor (TFT), a capacitor, and wiring for connecting the TFT and the capacitor, is formed. The TFT includes a gate electrode and an active layer. The active layer includes a channel region, a source region, and a drain region. The gate electrode is formed above the channel region. The gate electrode is electrically insulated from the active layer by a gate insulating layer interposed therebetween.

The active layer of the TFT is formed of a semiconductor material including amorphous silicon or polysilicon. When the active layer is formed of amorphous silicon, the mobility decreases such that it is difficult to produce a driving circuit that operates at high speeds. When the active layer is formed of polysilicon, the mobility increases but a threshold voltage is not uniform such that it is necessary to arrange a separate compensation circuit. Conventional methods for manufacturing a TFT by using low temperature polysilicon (LTPS) generally include highly expensive processes such as a laser thermal treatment or the like. Conventional methods for manufacturing a TFT using LTPS therefore require high investment costs and management costs and is not easily applied to a large substrate.

Oxide semiconductors may be used to form the active later. When an organic light-emitting display apparatus that uses an oxide semiconductor has a bottom gate structure, at least seven mask processes are required for top emission. Since low resistance wiring and an inorganic planarization layer are required in creating a large panel, seven or more mask processes may be necessary.

SUMMARY OF THE INVENTION

The present invention provides an organic light-emitting display apparatus having low resistance wiring and a method of manufacturing the organic light-emitting display apparatus utilizing a reduced number of masks.

According to an aspect of the present invention, there is provided an organic light-emitting display apparatus including a substrate. A capacitor is formed on the substrate. The capacitor includes a first lower electrode, a second lower electrode, an upper electrode, a first insulating layer between the first lower electrode and the second lower electrode, and a second insulting layer between the second lower electrode and the upper electrode. A thin film transistor (TFT) includes a gate electrode formed on a same layer as the first lower electrode, an active layer, and source and drain electrodes formed on a same layer as the upper electrode. A wiring is formed from the same material layer as the second lower electrode.

A thickness of the second lower electrode may be equal to or greater than a thickness of the gate electrode or the first lower electrode.

The first insulating layer may include a metal oxide layer including metal oxide and a protective layer including an insulating material.

An insulating layer between the gate electrode and the active layer may be formed as a portion of the second insulating layer.

The active layer may include an oxide semiconductor.

The organic light-emitting display apparatus may further include a pixel electrode connected with the TFT, an intermediate layer formed on the pixel electrode, and an opposite electrode formed on the intermediate layer.

The second lower electrode may include Mo—Al—Mo, Ti—Cu, Ti—Cu—Ti, and/or IZO-C-GZO.

A semiconductor layer may be additionally formed between the second insulating layer and the upper electrode.

According to other aspect of the present invention, a capacitor includes a first lower electrode. A second lower electrode has a thickness equal to or greater than a thickness of the first lower electrode. A first insulating layer insulates the first lower electrode from the second lower electrode. The first insulating later includes a metal oxide layer. An upper electrode is also included in the capacitor. A second insulating layer insulates the second lower electrode from the first insulating layer.

According to an aspect of the present invention, there is provided a method of manufacturing an organic light-emitting display apparatus. The method includes a first mask process including forming a first lower electrode, a first insulating layer, and a second lower electrode having a thickness greater than a thickness of the first lower electrode on a substrate. A second mask process includes forming a gate insulating layer and a semiconductor layer on the second lower electrode. An active layer is formed by patterning the semiconductor layer. A third mask process includes forming a hole exposing an edge of the active layer, and forming an etch stopping layer covering the second lower electrode. A fourth mask process includes forming an upper electrode on the etch stopping layer.

When the second lower electrode is formed in the first mask process, a wiring of the organic light-emitting display apparatus may also be formed.

The first insulating layer may include a metal oxide layer and an auxiliary layer including $SiO_2$ or SiNx.

The auxiliary layer may be deposited using a plasma enhanced chemical vapor deposition (PECVD) method, an atmospheric pressure CVD (APCVD) method, or a low pressure CVD (LPCVD) method.

The second lower electrode may include Mo—Al—Mo, Ti—Cu, Ti—Cu—Ti, and/or IZO-C-GZO.

The semiconductor layer may include an oxide semiconductor.

The first mask process may involve forming a gate electrode on the same layer as the first lower electrode.

The fourth mask process may involve forming a source electrode and a drain electrode on the same layer as the upper electrode. The source and drain electrodes contact the active layer.

After the fourth mask process, the method may further include a fifth mask process including forming an insulating layer that covers the source and drain electrodes and the upper electrode and that includes a via hole for exposing one of the source and drain electrodes. A sixth mask process includes forming a pixel electrode on the insulating layer. The pixel electrode is connected with one of the source and drain electrodes through the via hole.

An organic light-emitting display apparatus includes a capacitor comprising a first lower electrode, a second lower electrode, an upper electrode, a first insulating layer disposed between the first lower electrode and the second lower electrode, and a second insulting layer disposed between the second lower electrode and the upper electrode. A thin film transistor (TFT) includes a gate electrode disposed on a same layer as the first lower electrode, an active layer comprising an oxide semiconductor, source, and drain electrodes, the source and drain electrodes disposed on a same layer as the upper electrode.

The thickness of the second lower electrode may be equal to or greater than the thickness of the gate electrode or the first lower electrode.

The second lower electrode may include Mo—Al—Mo, Ti—Cu, Ti—Cu—Ti, and/or IZO-C-GZO.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION OF THE INVENTION

Figure 1:
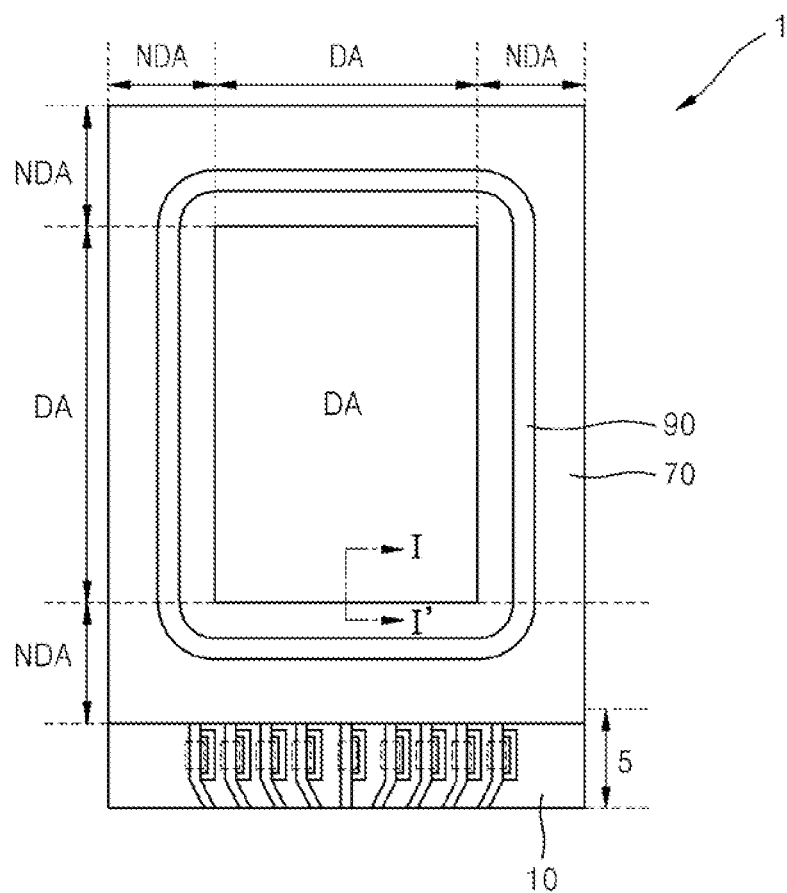
FIG. 1 is a plane view illustrating a structure of an organic light-emitting display apparatus according to an embodiment of the present invention.

Hereinafter, the present invention will be described in detail by explaining exemplary embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. Like reference numerals in the drawings may denote like or similar elements throughout the specification.

FIG. 1 is a plane view illustrating a structure of an organic light-emitting display apparatus 1 according to an embodiment of the present invention.

Referring to FIG. 1, the organic light-emitting display apparatus 1 includes a first substrate 10 and a second substrate 70, wherein the first substrate 10 includes a plurality of emission pixels and the second substrate 70 is bonded to the first substrate 10 via a sealing operation.

A thin film transistor (TFT), an organic light-emitting device, a capacitor, or the like may be formed on the first substrate 10. The first substrate 10 may be formed of a low temperature polysilicon (LTPS) crystalline silicon substrate, a glass substrate, or a plastic substrate.

The second substrate 70 may be an encapsulation substrate that is disposed on the first substrate 10 so as to protect the TFT and the emission pixels, which are formed on the first substrate 10, from outside moisture or air. The second substrate 70 is bonded with the first substrate 10 by a sealing member 90 that is disposed along edges of the first substrate 10 and the second substrate 70 while the second substrate 70 is aligned to face the first substrate 10. The second substrate 70 may be formed of a glass substrate, a plastic substrate, or a stainless using steel (SUS) substrate.

Although not illustrated, an emission region may be protected from the outside air, for example, by an encapsulation film (not shown) of the second substrate 70 that is formed on the first substrate 10 so as to encapsulate the emission region. In an embodiment, the encapsulation film may have a structure in which an inorganic layer formed of silicon oxide or silicon nitride and an organic layer formed of epoxy or polyimide alternate with each other. In an embodiment, the encapsulation film may have a structure including a layer formed of low melting glass such as SnO. However, a structure of the encapsulation film is not limited to the aforementioned structures and thus may be one of various thin film encapsulation structures.

The first substrate 10 includes an emission region DA for emission of light, and a non-emission region NDA at an outer region of the emission region DA. According to embodiments of the present invention, the sealing member 90 is disposed at the non-emission region NDA at the outer region of the emission region DA, and bonds the first substrate 10 and the second substrate 70.

As described above, the organic light-emitting device, the TFT that drives the organic light-emitting device, and wirings that are electrically connected with the organic light-emitting device and the TFT are formed in the emission region DA. The non-emission region NDA may include a pad region 5 having pad electrodes that extend from the wirings of the emission region DA.

Figure 2:
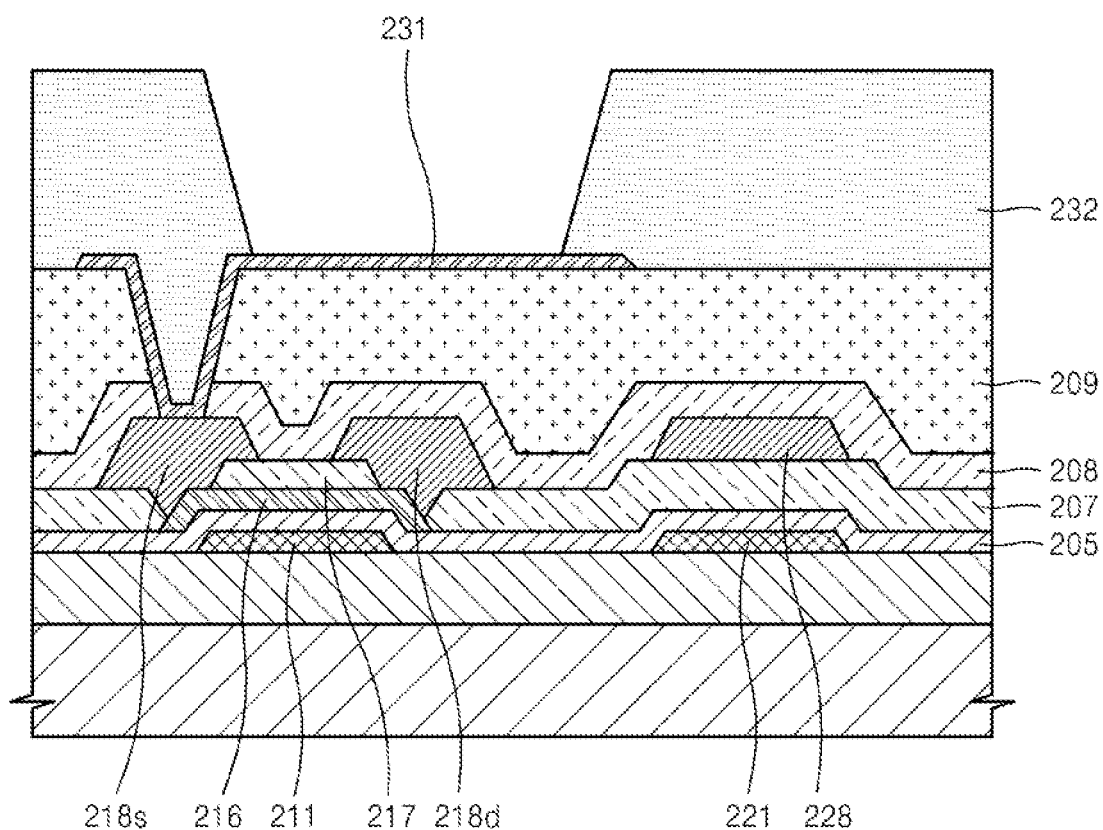
FIG. 2 illustrates a bottom-gate type organic light-emitting display.

FIG. 2 illustrates a bottom-gate type organic light-emitting display apparatus.

Referring to FIG. 2, the bottom-gate type organic light-emitting display apparatus using an oxide semiconductor utilizes eight mask processes. In the first mask process, a gate electrode 211 and a lower electrode 221 of a capacitor are patterned. In the second mask process, an active layer 217 is patterned. In the third mask process, an edge stop layer 207 is patterned. Then, in the fourth mask process, source/drain electrodes 218s/218d are formed. In the fifth mask process, a passivation layer 208 is formed. In the sixth mask process, a via hole is formed in a planarization layer 209. In the seventh mask process, a pixel electrode 231 is formed. In the eighth mask process, a pixel-defining layer (PDL) 232 is formed. As described above, the bottom-gate type organic light-emitting display apparatus using the oxide semiconductor uses eight mask processes.

Since a large panel is formed, a low resistance design is used in gate and source/drain wirings. However, since a thickness of wirings is increased for the low resistance design, problems may occur such that a thickness of insulation layers (a gate insulation layer and a passivation layer) has to be increased, a total number of masks has to be increased (when a gate electrode and low resistance wiring are formed at separate layers), or capacitance of a capacitor deteriorates.

Although not illustrated, in the bottom-gate type organic light-emitting display apparatus of FIG. 2, a conductor that is formed from the same material layer as the gate electrode 211 may be used as wiring. Thus, when the gate electrode 211 is heavily deposited so as to reduce resistance at wirings in a large-area organic light-emitting display apparatus, a thickness of a gate insulating layer 205 is also increased, such that capacitance of capacitors 221 and 228 that use the gate insulating layer 205 as a dielectric layer is decreased.

Also, in the bottom-gate type organic light-emitting display apparatus of FIG. 2, when a conductor that is formed from the same material layer as the source/drain electrodes 218s/218d is used as wiring, a thickness of the wiring is increased to achieve low resistance wiring, such that a thickness of the passivation layer 208 is also increased.

Also, when wiring is formed of a separate conductor layer so as to prevent an increase in the thicknesses of the gate electrode 211 and the source/drain electrodes 218s/218d, a separate mask process is used such that the manufacturing costs and a manufacturing time are increased.

Hereinafter, an embodiment of the present invention is described. A large-area bottom-gate type organic light-emitting display apparatus includes a TFT formed of an oxide semiconductor and that is able to form low resistance wiring. A method of manufacturing the large-area bottom-gate type organic light-emitting display apparatus is also provided. This method minimizes the number of masks used and the capacitance of a capacitor is maintained.

Figure 3:
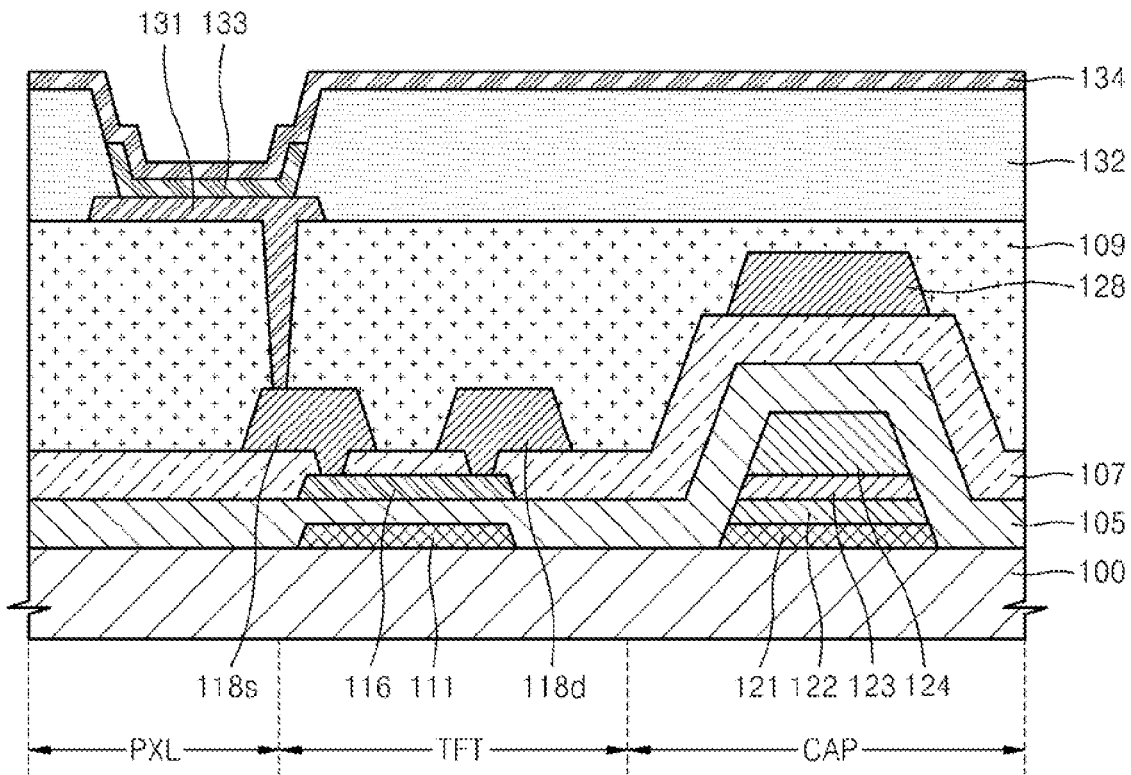
FIG. 3 is a cross-sectional view of the organic light-emitting display apparatus, taken along a line I-I' of FIG. 1.

FIG. 3 is a cross-sectional view of the organic light-emitting display apparatus 1, taken along a line I-I' of FIG. 1.

Referring to FIG. 3, the organic light-emitting display apparatus 1 includes at least one TFT, a capacitor, and an organic light-emitting device that is electrically connected with the TFT. The TFT, the capacitor, and the organic light-emitting device are formed at a TFT region TFT, a capacitor region CAP, and a pixel region PXL, respectively.

The TFT may be a top-gate type TFT, and may sequentially include a gate electrode 111, an active layer 116 that is insulated from the gate electrode 111 formed of an oxide semiconductor pattern, and source/drain electrodes 118s/118d that are insulated from the gate electrode 111 and that contact the active layer 116.

A first lower electrode 121, a metal oxide layer 122, an auxiliary layer 123, a second lower electrode 124, and an upper electrode 128 are included in the capacitor region CAP. The metal oxide layer 122 and the auxiliary layer 123 are formed between the first lower electrode 121 and the second lower electrode 124.

The first lower electrode 121 is formed from the same material layer as the gate electrode 111. Materials that form the metal oxide layer 122, the auxiliary layer 123, and the second lower electrode 124 are sequentially stacked on the first lower electrode 121, and residual regions excluding the metal oxide layer 122, the auxiliary layer 123, and the second lower electrode 124 on the first lower electrode 121 are removed by using a halftone mask.

By doing so, a double capacitor may be formed in the capacitor region CAP, and a thickness of wiring may be increased. Since the second lower electrode 124 functions as a wiring electrode, a thickness of the gate electrode 111 is not increased, so that a thickness of a gate insulating layer 105 is not increased, thus, capacitance of the capacitor is not decreased. Also, it is not required to additionally induce a mask process so as to separately arrange a low resistance wiring electrode other than the gate electrode 111.

Referring to FIG. 3, the second lower electrode 124 is further formed. The second lower electrode 124 is heavy as compared to the gate electrode 111 and the first lower electrode 121. Thus, low resistance wiring may be obtained by forming wiring from the same material layer as the second lower electrode 124. Here, the second lower electrode 124 may have a double or triple wiring structure.

The organic light-emitting display apparatus 1 may have a double electrode included in the capacitor region, and the metal oxide layer 122 and the auxiliary layer 123 are included between the first lower electrode 121 and the second lower electrode 124. In this regard, unlike the example described above with respect to FIG. 2, each of the first lower electrode 121 and the second lower electrode 124 has a double structure, so that the double capacitor may be formed. The metal oxide layer 122 is formed of metal oxide having a low conductivity, and the auxiliary layer 123 is formed of a low conductive material, so that they constitute an insulator.

FIGS. 4 through 9 are cross-sectional views illustrating a procedure of manufacturing the organic light-emitting display apparatus 1 of FIG. 3. Hereinafter, the procedure of manufacturing the organic light-emitting display apparatus 1 of FIG. 3 will be described.

First, a substrate 100 for the manufacture of the organic light-emitting display apparatus 1 is prepared.

The substrate 100 may be formed of a transparent glass material containing $SiO_2$ as a main component. However, a material of the substrate 100 is not limited thereto, and thus, the substrate 100 may be formed of various materials including a transparent plastic material, a metal material, or the like.

To block impurity ions from diffusing onto a top surface of the substrate 100, to block moisture or outside air from penetrating into the top surface, and to planarize the top surface, a barrier layer (not shown), a blocking layer (not shown), and/or a buffer layer (not shown) may be formed on the top surface. The buffer layer may be formed of $SiO_2$ and/or SiNx by using one of various deposition methods including a plasma enhanced chemical vapor deposition (PECVD) method, an atmospheric pressure CVD (APCVD) method, a low pressure CVD (LPCVD) method, or the like.

Figure 4A:
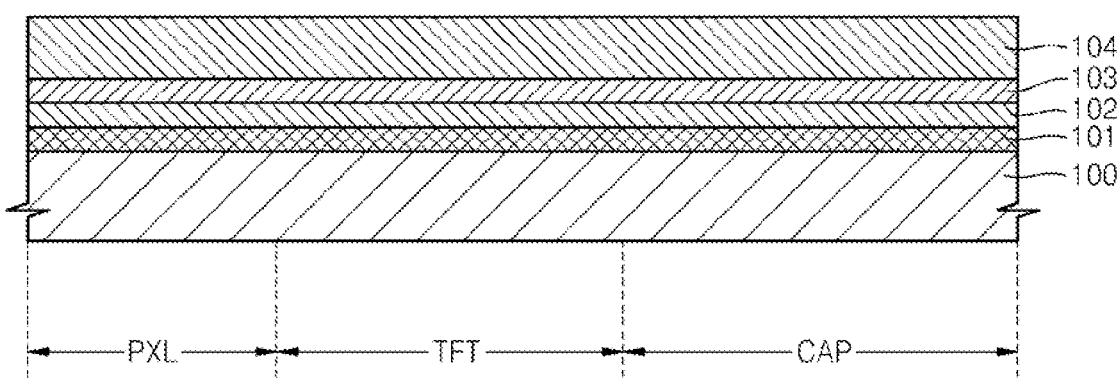
FIGS. 4A through 4B are cross-sectional views illustrating processes of manufacturing the organic light-emitting display apparatus shown in FIG. 3, according to an embodiment of the present invention.

Next, as illustrated in FIG. 4A, a first conductive layer 101, a first insulating layer 102, a second insulating layer 103, and a second conductive layer 104 are sequentially stacked on the substrate 100.

The first conductive layer 101 may include molybdenum (Mo), aluminum (Al), platinum (Pt), lead (Pb), gold (Au), titanium (Ti), and/or copper (Cu). The first conductive layer 101 may not need to have low resistance, and thus, the first conductive layer 101 may be formed of single metal having a small thickness. At a later time, the first conductive layer 101 may be patterned as the gate electrode 111 and the first lower electrode 121.

Also, the first insulating layer 102 may be formed of metal oxide including GaInZnO (GIZO), HfInZnO (HIZO), SnInZnO (TIZO), GaZnO (GZO), and/or ZnO and may function as an insulator having low conductivity. The first insulating layer 102 may later be patterned as a metal oxide layer 122.

The second insulating layer 103 may be formed of $SiO_2$ and/or SiNx, and since the first insulating layer 102 having low conductivity is formed below the second insulating layer 103, the second insulating layer 103 may be deposited by using a PECVD method, an ASCVD method, or an LPCVD method. The second insulating layer 103 may later be patterned as the auxiliary layer 123.

The second conductive layer 104 may include Ag, Mg, Al, Pt, Pd, Au, Ni, Nd, Ir, Cr, Li, Ca, Mo, Ti, W, MoW, Al and/or Cu. The second conductive layer 104 may have a double-layer structure or a triple-layer structure, e.g., Mo—Al—Mo, Ti—Cu, Ti—Cu—Ti, or IZO-C-GZO. The second conductive layer 104 may have a thickness greater than the thickness of the first conductive layer 101, thereby having a low resistance characteristic. At a later time, the second conductive layer 104 may be patterned as a second lower electrode 124 and a wiring electrode (not shown).

Figure 4B:
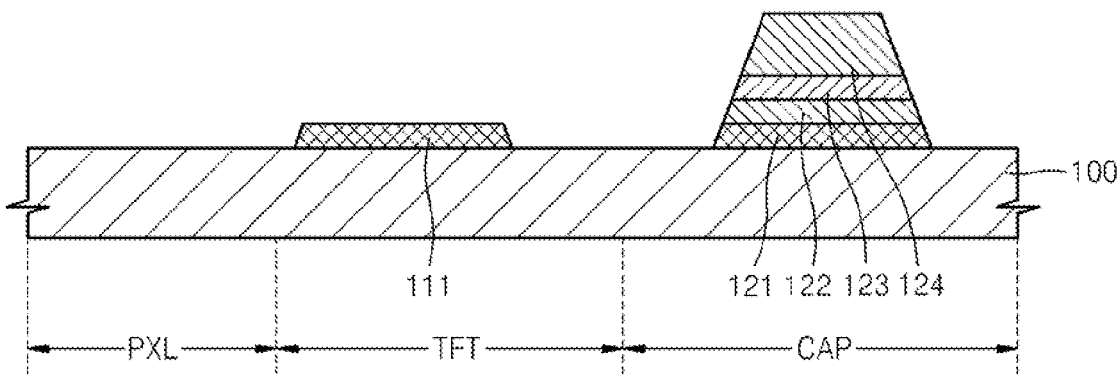

Next, as illustrated in FIG. 4B, the first conductive layer 101, the first insulating layer 102, the second insulating layer 103, and the second conductive layer 104 are patterned together via a first mask process.

The first conductive layer 101 is patterned as the gate electrode 111 and the first lower electrode 121, the first insulating layer 102 is patterned as the metal oxide layer 122, the second insulating layer 103 is patterned as the auxiliary layer 123, and the second conductive layer 104 is patterned as the second lower electrode 124. Here, the first mask process corresponds to a half-tone mask process in which all layers excluding the first conductive layer 101 may be patterned and then removed in the transistor region TFT, and portions of the first insulating layer 102, the second insulating layer 103, and the second conductive layer 104 may be allowed remain in the capacitor region CAP.

As a result of the first mask process, a capacitor including the first lower electrode 121 and the second lower electrode 124 may be formed in the capacitor region CAP, and a low resistance wiring may be formed by pattering the first conductive layer 101 that forms the gate electrode 111 and the second conductive layer 104 that forms a low resistance wiring, via one mask process, without having to perform separate mask processes.

Figure 5A:
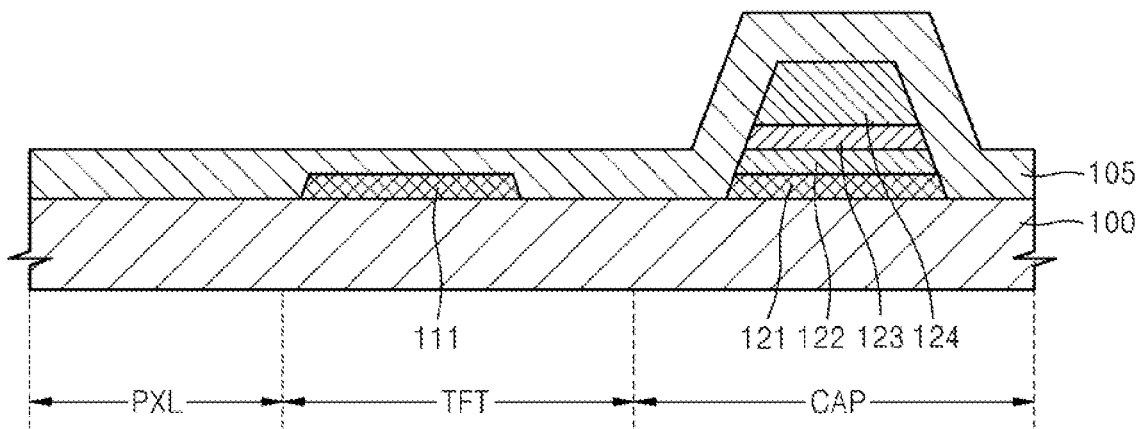
FIGS. 5A through 5B are cross-sectional views illustrating processes of manufacturing the organic light-emitting display apparatus shown in FIG. 3, according to an embodiment of the present invention.

Next, as illustrated in FIG. 5A, the gate insulating layer 105 is deposited on an entire surface of the substrate 100. The gate insulating layer 105 may be formed of an insulating inorganic material such as SiNx or SiOx, or may be formed of an insulating organic material. Next, as illustrated in FIG. 5B, a semiconductor layer (not shown) is deposited on the substrate 100, and then the active layer 116 is patterned in such a manner that the semiconductor layer is patterned via a second mask process.

Figure 5B:
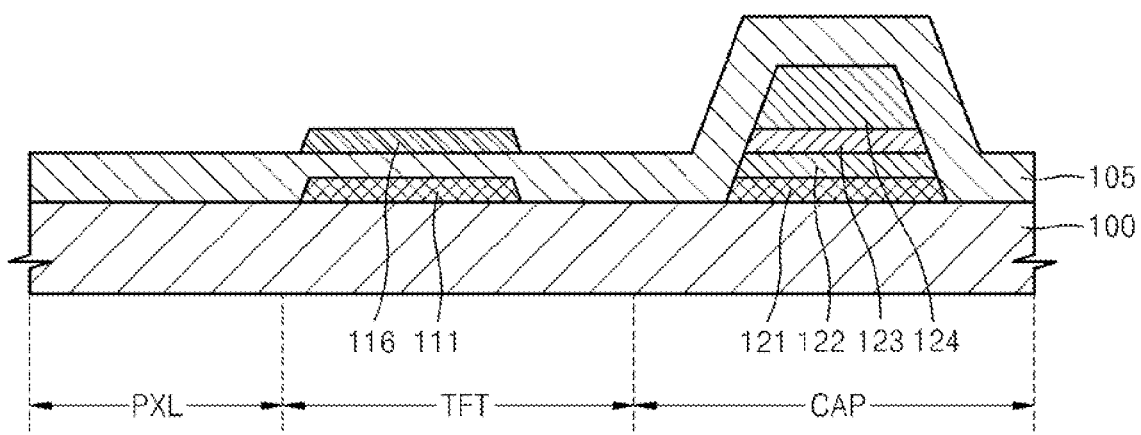

Referring to the embodiment shown in FIGS. 3 and 5B, a semiconductor layer (not shown) is completely removed from the capacitor region CAP, but alternatively, a portion of the semiconductor layer (not shown) may remain in the capacitor region CAP. In this case, an etch stopping layer 107 formed on the semiconductor layer (not shown) of the capacitor region CAP may also be removed in a process to be described with reference to FIG. 6, so that the semiconductor layer (not shown) and the upper electrode 128 may contact each other.

Here, the active layer 116 may include an oxide semiconductor. The oxide semiconductor may include oxide of indium (In), gallium (Ga), Tin (Sn), zirconium (Zr), vanadium (V), hafnium (Hf), cadmium (Cd), germanium (Ge), chromium (Cr), titanium (Ti), and/or zinc (Zn). For example, the oxide semiconductor may include gallium (Ga), indium (In), and zinc (Zn) that are in a composition ratio of 2:2:2 (atomic %). However, a material of the oxide semiconductor is not limited thereto and thus the oxide semiconductor may be formed of four-component metal oxide such as In—Sn—Ga—Zn—O-based oxide, three-component metal oxide such as In—Ga—Zn—O-based oxide, In—Sn—Zn—O-based oxide, In—Al—Zn—O-based oxide, Sn—Ga—Zn—O-based oxide, Al—Ga—Zn—O-based oxide, Sn—Al—Zn—O-based oxide, or Cd—Sn—O-based oxide, two-component metal oxide such as In—Zn—O-based oxide, Sn—Zn—O-based oxide, Al—Zn—O-based oxide, Zn—Mg—O-based oxide, Sn—Mg—O-based oxide, or In—Mg—O-based oxide, or one-component metal oxide such as In—O-based oxide, Sn—O-based oxide, Zn—O-based oxide, Ti—O-based oxide, or Cd—O-based oxide. Here, the In—Sn—Ga—Zn—O-based oxide semiconductor corresponds to oxide including at least In, Ga, and Zn, and its composition ratio is not particularly limited. Also, the In—Sn—Ga—Zn—O-based oxide semiconductor may include another element in addition to In, Ga, and Zn.

Figure 6:
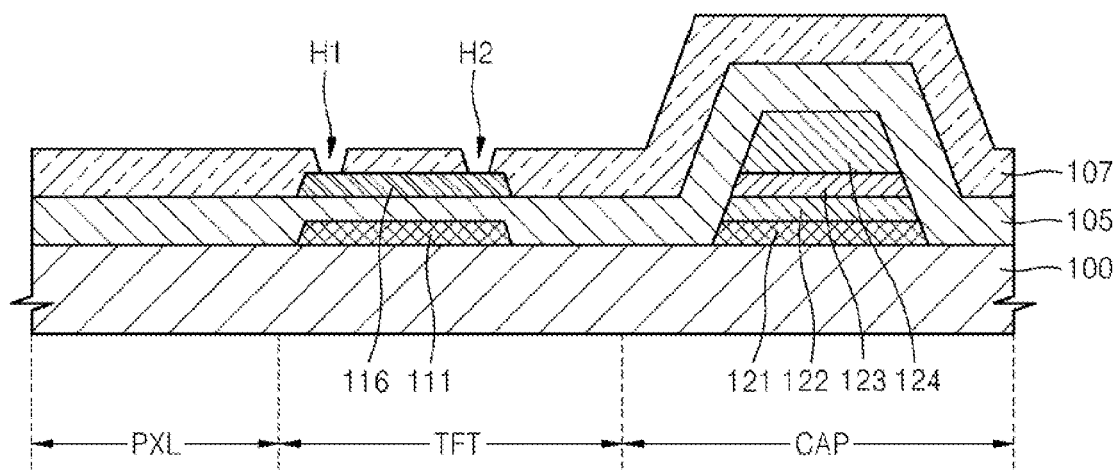
FIGS. 6 through 9 are cross-sectional views illustrating processes of manufacturing the organic light-emitting display apparatus shown in FIG. 3, according to an embodiment of the present invention.

Next, referring to FIG. 6, the etch stopping layer 107 is formed.

The etch stopping layer 107 may be formed in a manner that an insulating layer (not shown) including an inorganic material including at least one of SiNx and SiOx is formed on the gate insulating layer 105 so as to cover the active layer 116, and then the insulating layer is patterned via a third mask process so as to have holes H1 and H2 that correspond to an edge of the active layer 116. The etch stopping layer 107 prevents the active layer 116 from being damaged when the source electrode 118s and the drain electrode 118d are patterned at a later time.

Figure 7:
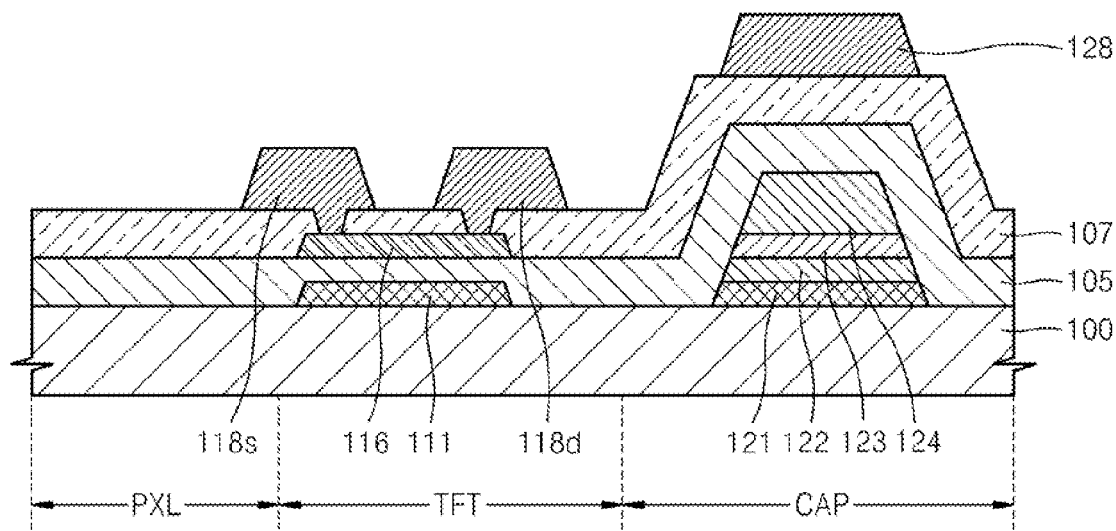

Next, referring to FIG. 7, the source electrode 118s and the drain electrode 118d, and the upper electrode 128 are formed.

First, a conductive layer (not shown) is formed on the etch stopping layer 107 so as to fill holes of the etch stopping layer 107, and then the conductive layer is patterned via a process using a fourth mask (not shown), so that the source electrode 118s and the drain electrode 118d that correspond to the active layer 116, and the upper electrode 128 that is formed from the same material layer as the source electrode 118s or the drain electrode 118d are formed in the capacitor region CAP.

Metal that forms the source electrode 118s and the drain electrode 118d, and the upper electrode 128 may have a single-layered structure or a multi-layered structure including aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

Figure 8:
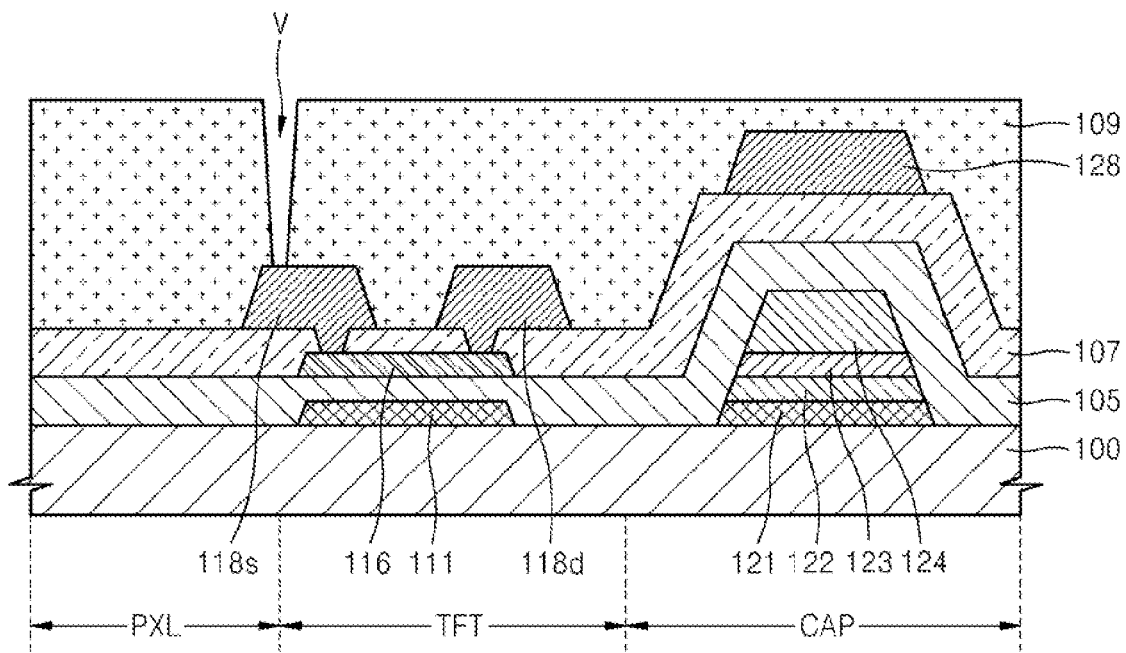

Next, referring to FIG. 8, a planarization layer 109 is formed.

Referring to FIG. 8, first, an insulating layer (not shown) is formed on the etch stopping layer 107. The first insulating later covers the source electrode 118s and the drain electrode 118d, and the upper electrode 128, and then is patterned via a process using a fifth mask (not shown), so that the planarization layer 109 having a via hole V for exposing one of the source electrode 118s and the drain electrode 118d is formed.

The planarization layer 109 is formed of polyimide, polyamide, acryl resin, benzocyclobutene, and/or phenol resin, by a spin coating method, and functions to maintain planarization of a top surface, so that the planarization layer 109 prevents a defect of the organic light-emitting device.

Next, the organic light-emitting device is formed on the planarization layer 109 in the pixel region PXL. The organic light-emitting device is formed of a pixel electrode 131 and an opposite electrode 134, and an emission layer (EML) 133 including an organic emission material that is interposed between the pixel electrode 131 and opposite electrode 134. Here, the pixel electrode 131 may be used as an anode, and the opposite electrode 134 may be used as a cathode. However, polarities of the electrodes may be switched.

Figure 9:
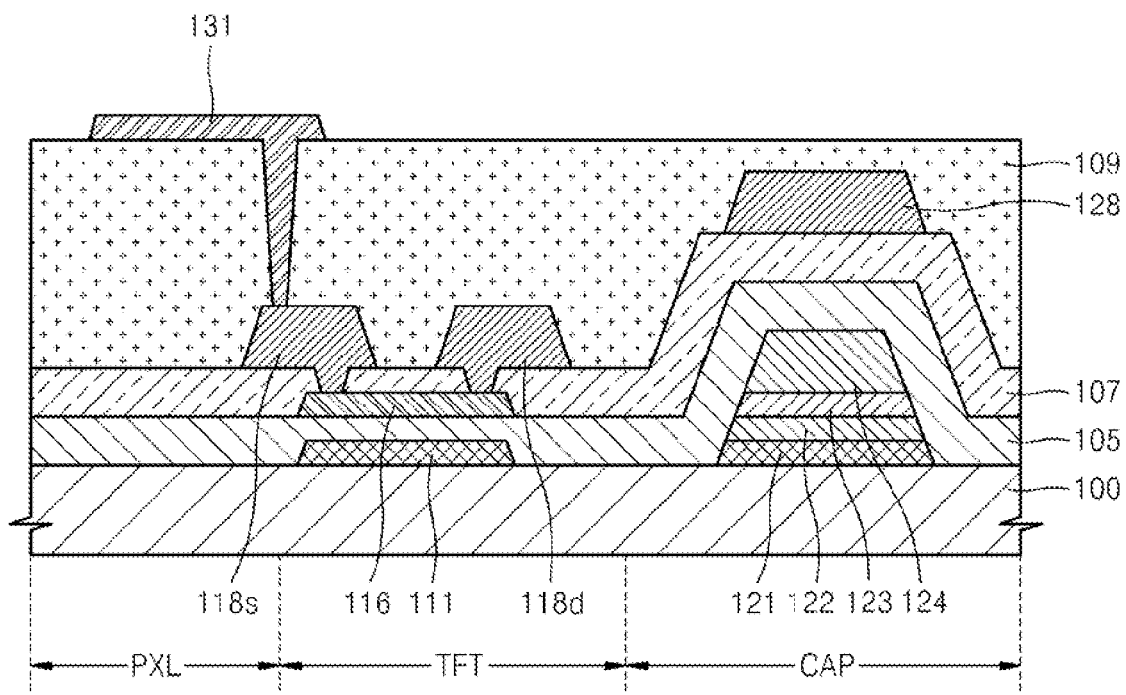

Referring to FIG. 9, a conductive layer (not shown) is deposited on an entire surface of the planarization layer 109, and then is patterned via a sixth mask process, so that the pixel electrode 131 is formed.

The pixel electrode 131 is formed on a top surface of the planarization layer 109, and is electrically connected with a TFT via the via hole V formed in the planarization layer 109. The pixel electrode 131 may be formed of various materials according to an emission type of the organic light-emitting display apparatus 1. For example, when the organic light-emitting display apparatus 1 is a bottom emission type organic light-emitting display apparatus 1, in which an image is realized toward the substrate 100, or is a dual-emission type organic light-emitting display apparatus 1, in which an image is realized toward the substrate 100 and is realized away from the substrate 100, the pixel electrode 131 may be formed of transparent metal oxide. The pixel electrode 131 may include ITO, IZO, ZnO, and/or $In_2O_3$ that are transparent conductive materials. When the organic light-emitting display apparatus 1 is a top-emission type organic light-emitting display apparatus 1 in which an image is realized away from the substrate 100, the pixel electrode 131 may further include a reflective electrode that is formed of a material that reflects light.

Next, a procedure of forming a pixel defining layer (PDL) 132, the EML 133, and the opposite electrode 134 on the pixel electrode 131 will be described with reference to FIG. 3.

An insulating layer (not shown) is formed on an entire surface of the pixel electrode 131, and to define an emission portion, an opening for exposing the pixel electrode 131 is formed in the insulating layer via a seventh mask process, and then is formed in the PDL 132.

Next, the EML 133 is formed on the pixel electrode 131 that is exposed via the opening. The EML 133 may have a single-layer structure or a multi-layer structure in which one or more layers from among an emissive layer, a hole transport layer (HTL), a hole injection layer (HIL), an electron transport layer (ETL), and an electron injection layer (EIL) are stacked.

The opposite electrode 134 may be deposited as a common electrode on an entire surface of the substrate 100. The opposite electrode 134 may be formed by thinly depositing Ag, Mg, Al, Pt, Pd, Au, Ni, Nd, Ir, Cr, Li, Ca, lithium fluoride (LiF), or a compound of any of these. According to an emission direction, the opposite electrode 134 may be formed as a reflective electrode or a translucent electrode.

A capping layer (not shown) including an organic material to protect the opposite electrode 134 may be further formed on the opposite electrode 134.

The EML 133 is formed in a hole, so that different emission materials are formed in pixels, respectively, but the one or more embodiments of the present invention are not limited thereto. The EML 133 may be commonly formed on an entire surface of the planarization layer 109, regardless of positions of the pixels. Here, the EML 133 may be formed in such a manner that layers including emission materials for emitting red, green, and blue colors may be vertically stacked or may be formed while the emission materials are mixed. If the EML 133 can emit a white color, the EML 133 may have combination of different colors. Also, the EML 133 may further have a color conversion layer or a color filter to convert the emitted white color into a predetermined color.

To protect the organic light-emitting device formed on the substrate 100 from the outside air, an encapsulation layer (not shown) is formed on an entire surface of the substrate 100 so as to cover the organic light-emitting device. The encapsulation layer may have a structure in which an organic material and an inorganic material alternate with each other, or may have a structure in which a low melting inorganic material is singularly formed.

While one TFT and one capacitor are shown in the drawings, this structure is provided for convenience of description. Thus, the one or more embodiments of the present invention are not limited thereto, and in this regard, a plurality of the TFTs and a plurality of capacitors may be included, provided that the TFTs and the capacitors do not increase a total number of mask processes.

According to the one or more embodiments of the present invention, the organic light-emitting device is arranged in the pixel region PXL, and thus, the structure shown in FIG. 3 may be used as an organic light-emitting display apparatus. However, the one or more embodiments of the present invention are not limited thereto. For example, if a liquid crystal is arranged between the pixel electrode and the opposite electrode, the structure shown in FIG. 3 may be used as a liquid crystal display (LCD) device.

In the organic light-emitting display apparatus according to the one or more embodiments of the present invention, low resistance wiring may be implemented and capacitance of the capacitor may be increased without requiring an additional mask process.

The particular implementations shown and described herein are illustrative examples of the invention and are not intended to otherwise limit the scope of the invention in any way. It should be noted that many alternative or additional functional relationships, physical connections or logical connections may be present in a practical device.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. An organic light-emitting display apparatus comprising:
   a substrate;
   a capacitor disposed on the substrate, the capacitor comprising a first lower electrode, a second lower electrode, an upper electrode, a first insulating layer disposed between the first lower electrode and the second lower electrode, and a second insulting layer disposed between the second lower electrode and the upper electrode;
   a thin film transistor (TFT) comprising a gate electrode disposed on a same layer as the first lower electrode, an active layer, and source and drain electrodes, wherein the source and drain electrodes are disposed on a same layer as the upper electrode; and
   a wiring including a same material layer as the second lower electrode,
   wherein the first insulating layer comprises:
      a metal oxide layer comprising metal oxide; and
      a protective layer comprising an insulating material.

2. The organic light-emitting display apparatus of claim 1, wherein a thickness of the second lower electrode is equal to or greater than a thickness of the gate electrode or the first lower electrode.

3. The organic light-emitting display apparatus of claim 1, wherein an insulating layer disposed between the gate electrode and the active layer is formed as a portion of the second insulating layer.

4. The organic light-emitting display apparatus of claim 1, wherein the active layer comprises an oxide semiconductor.

5. The organic light-emitting display apparatus of claim 1, further comprising:
   a pixel electrode connected with the TFT, an intermediate layer disposed on the pixel electrode, and an opposite electrode disposed on the intermediate layer.

6. The organic light-emitting display apparatus of claim 1, wherein a semiconductor layer is additionally disposed between the second insulating layer and the upper electrode.

7. An organic light-emitting display apparatus comprising:
- a substrate;
- a capacitor disposed on the substrate, the capacitor comprising a first lower electrode, a second lower electrode, an upper electrode, a first insulating layer disposed between the first lower electrode and the second lower electrode, and a second insulting layer disposed between the second lower electrode and the upper electrode;
- a thin film transistor (TFT) comprising a gate electrode disposed on a same layer as the first lower electrode, an active layer, and source and drain electrodes, wherein the source and drain electrodes are disposed on a same layer as the upper electrode; and
- a wiring including a same material layer as the second lower electrode,
- wherein the second lower electrode comprises a structure including Mo—Al—Mo, Ti—Cu, Ti—Cu—Ti, or IZO-C-GZO.

8. A capacitor comprising:
- a first lower electrode;
- a second lower electrode having a thickness equal to or greater than a thickness of the first lower electrode;
- a first insulating layer insulating the first lower electrode from the second lower electrode, the first insulating layer comprising a metal oxide layer;
- an upper electrode; and
- a second insulating layer insulating the second lower electrode from the first insulating layer.

9. An organic light-emitting display apparatus comprising:
- a capacitor comprising a first lower electrode, a second lower electrode, an upper electrode, a first insulating layer disposed between the first lower electrode and the second lower electrode, and a second insulting layer disposed between the second lower electrode and the upper electrode; and
- a thin film transistor (TFT) comprising a gate electrode disposed on a same layer as the first lower electrode, an active layer comprising an oxide semiconductor, and source and drain electrodes, wherein the source and drain electrodes are disposed on a same layer as the upper electrode,
- wherein the first insulating layer comprises:
  - a metal oxide layer comprising metal oxide; and
  - a protective layer comprising an insulating material.

10. The organic light-emitting display apparatus of claim 9, wherein a thickness of the second lower electrode is equal to or greater than a thickness of the gate electrode or the first lower electrode.

* * * * *